(12) United States Patent
Akyildiz et al.

(10) Patent No.: US 9,825,712 B2
(45) Date of Patent: *Nov. 21, 2017

(54) ULTRA MASSIVE MIMO COMMUNICATION IN THE TERAHERTZ BAND

(71) Applicants: Ian F. Akyildiz, Alpharetta, GA (US); Josep M. Jornet, Clarence Center, NY (US)

(72) Inventors: Ian F. Akyildiz, Alpharetta, GA (US); Josep M. Jornet, Clarence Center, NY (US)

(73) Assignees: Georgia Tech Research Corporation, Atlanta, GA (US); The Research Foundation For the State University of New York, Amherst, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/211,503

(22) Filed: Jul. 15, 2016

(65) Prior Publication Data
US 2016/0323041 A1 Nov. 3, 2016

Related U.S. Application Data

(63) Continuation-in-part of application No. 14/560,213, filed on Dec. 4, 2014, now Pat. No. 9,397,758.
(Continued)

(51) Int. Cl.
*H01L 29/66* (2006.01)
*H04B 10/90* (2013.01)
(Continued)

(52) U.S. Cl.
CPC ............ *H04B 10/90* (2013.01); *H01L 23/14* (2013.01); *H01L 23/58* (2013.01);
(Continued)

(58) Field of Classification Search
CPC H01L 29/2003; H01L 29/201; H01L 29/7787
(Continued)

(56) References Cited

U.S. PATENT DOCUMENTS 7,947,955 B2    5/2011    Kawano et al.
8,507,890 B1    8/2013    Koppens et al.
(Continued)

FOREIGN PATENT DOCUMENTS

CN    102621767 A    12/2013
CN    103325796 A    12/2013
(Continued)

OTHER PUBLICATIONS

Llaster et al.: "Characterization of Graphene-based Nano-antennas in the Terahertz Band"; Jan. 7, 2012.
(Continued)

*Primary Examiner* — Tan N Tran
(74) *Attorney, Agent, or Firm* — Bryan W. Bockhop; Bockhop Intellectual Property Law, LLC

(57) ABSTRACT

A communication system includes a two-dimensional array of a plurality of plasmonic nano-antennas. Each plasmonic nano-antenna supports a surface plasmon polariton wave. A plurality of communications elements each excite a corresponding one of the plasmonic nano-antennas, thereby causing a surface plasmon polariton wave that corresponds to a signal to form on each of the plasmonic nano-antennas.

18 Claims, 6 Drawing Sheets

Related U.S. Application Data

(60) Provisional application No. 62/303,422, filed on Mar. 4, 2016, provisional application No. 61/912,943, filed on Dec. 6, 2013.

(51) Int. Cl.

| | | |
|---|---|---|
| *H01L 29/49* | (2006.01) | |
| *H01L 23/58* | (2006.01) | |
| *H01L 23/14* | (2006.01) | |
| *H01L 29/08* | (2006.01) | |
| *H01L 29/778* | (2006.01) | |
| *H01L 29/20* | (2006.01) | |
| *H01L 29/205* | (2006.01) | |
| *H01L 29/16* | (2006.01) | |

(52) U.S. Cl.
CPC ...... *H01L 29/0843* (2013.01); *H01L 29/1606* (2013.01); *H01L 29/20* (2013.01); *H01L 29/2003* (2013.01); *H01L 29/205* (2013.01); *H01L 29/49* (2013.01); *H01L 29/7786* (2013.01); *H01L 29/7787* (2013.01)

(58) Field of Classification Search
USPC .................................. 257/76, 194, E29.246
See application file for complete search history.

(56) References Cited

U.S. PATENT DOCUMENTS

| | | | |
|---|---|---|---|
| 8,546,848 B2 | 10/2013 | Sato | |
| 8,554,022 B1 | 10/2013 | Hochbert et al. | |
| 8,610,617 B1 | 12/2013 | Avouris et al. | |
| 9,250,389 B2 * | 2/2016 | Avouris | ............... G02B 6/1226 |
| 9,397,758 B2 * | 7/2016 | Akyildiz | ............... H04B 10/90 |
| 2011/0309335 A1 | 12/2011 | Mehr et al. | |
| 2012/0161098 A1 | 6/2012 | Hiura et al. | |
| 2012/0261673 A1 | 10/2012 | Schulze et al. | |
| 2012/0292596 A1 | 11/2012 | Dabrowski et al. | |
| 2013/0015375 A1 | 1/2013 | Avouris et al. | |
| 2014/0091309 A1 | 4/2014 | Hallin | |
| 2014/0306184 A1 | 10/2014 | Ruhl et al. | |
| 2016/0161644 A1 * | 6/2016 | Verschuuren | ......... H01L 33/508 250/396 R |

FOREIGN PATENT DOCUMENTS

| | | |
|---|---|---|
| WO | 2012119125 A2 | 9/2012 |
| WO | 2013016601 A1 | 1/2013 |
| WO | 2013083351 A1 | 6/2013 |
| WO | 2013112608 A1 | 8/2013 |
| WO | 2013184072 A1 | 12/2013 |

OTHER PUBLICATIONS

Otsuji et al.: "Emission and Detection of Terahertz Radiation Using Two-Dimensional Electrons in III-V Semiconductors and Graphene"; Jul. 1, 2012.

Abadal et al.: "Graphene-enabled Wireless Networks-on-Chip"; (Publication date unknown, assumed to be prior art).

Mohammadi et al.: "Tackling Terahertz Transceiver Design"; Terahertz Technology: Tackling Terahertz Transceiver Design; Apr. 30, 2013.

Jornet: "Terahertz Communications for Graphene-based Nano-devices"; IEEE P802.15 Working Group for Wireless Personal Area Networks (WPANs); Nov. 8, 2010.

School of Electrical and Computer Engineering, Georgia Institute of Technology: "TeraNets" Ultra-broadband Communication Networks in the Terahertz Band; Dec. 20, 2013.

* cited by examiner

ULTRA MASSIVE MIMO COMMUNICATION IN THE TERAHERTZ BAND

CROSS-REFERENCE TO RELATED APPLICATION(S)

This application claims the benefit of U.S. Provisional Patent Application Ser. No. 62/303,422, filed Mar. 4, 2016, the entirety of which is hereby incorporated herein by reference.

This application is a continuation-in-part of, and claims the benefit of, U.S. patent application Ser. No. 14/560,213, filed Dec. 4, 2014, now issued as U.S. Pat. No. 9,397,758, which is a non-provisional application claiming priority on U.S. Provisional Patent Application Ser. No. 61/912,943, filed on Dec. 6, 2013, the entirety of each of which is hereby incorporated herein by reference.

BACKGROUND OF THE INVENTION

1. Field of the Invention

The present invention relates to communications devices and, more specifically, to a plasmonic communications device.

2. Description of the Related Art

Wireless data traffic has drastically increased due to a change in the way information is created, shared and consumed. This change has been accompanied by an increasing demand for much higher speed wireless communication systems. In particular, wireless data rates have doubled about every eighteen months over the last three decades and they are quickly approaching the capacity of wired communication systems. Following this trend, wireless terabit-per-second (Tbps) data links will be needed within the next five to ten years. Advanced physical layer solutions and, more importantly, new spectral bands will be required to support these extremely high data rates.

In this context, terahertz (THz) band communication is envisioned as a key wireless technology to satisfy this demand by alleviating the spectrum scarcity and capacity limitations of current wireless systems, and enabling many applications in diverse fields. The THz band is the spectral band that spans the frequencies between 0.1 THz and 10 THz.

Wireless technologies below 0.1 THz are generally not able to support Tbps links. On the one hand, advanced digital modulations, e.g., Orthogonal Frequency Division Multiplexing (OFDM), and sophisticated communication schemes, e.g., very large scale Multiple Input Multiple Output (MIMO) systems, are being used to achieve a very high spectral efficiency at frequencies below 5 GHz. However, the scarcity of the available bandwidth limits the achievable data rates. For example, in Long-Term Evolution Advanced (LTEA) networks, peak data rates in the order of 1 Gbps are possible when using a four-by-four MIMO scheme over a 100 MHz aggregated bandwidth. These data rates are three orders of magnitude below the targeted 1 Tbps. On the other hand, millimeter wave (mm-wave) communication systems, such as those at 60 GHz, can support data rates in the order of 10 Gbps within one meter. This data rate is still two orders of magnitude below the expected demand. The path to improve the data rate involves the development of more complex transceiver architectures able to implement physical layer solutions with much higher spectral efficiency. However, the usable bandwidth is usually limited to less than 7 GHz, which effectively imposes an upper bound on the data rates.

Wireless data rates have doubled every eighteen months for the last three decades. Following this trend, Terabit-per-second (Tbps) links are expected to become a reality within the next five years. The limited bandwidth in wireless communication systems under 5 GHz motivates the utilization of higher frequency bands. In this direction, millimeter-wave (mm-wave) communication (30-300 GHz) has been heavily investigated in the recent years. Despite the opportunities that come with such systems, the total consecutive available bandwidth for mm wave communication is still less than 10 GHz. This would require a physical layer efficiency of almost 100 bit/s/Hz to support Tbps, which is several times higher than that of the state of the art for existing communication systems. This result motivates the exploration of even higher frequency bands.

In this context, Terahertz (THz) band (0.06-10 THz) communication is envisioned as a key wireless technology to enable Tbps links. The available bandwidth in the THz band drastically changes with distance, and ranges from almost 10 THz for distances below one meter to multiple transmission windows hundreds of GHz wide each for longer distances. However, this very large bandwidth comes at the cost of a very high propagation loss. On the one hand, the much smaller effective area of THz antennas, which is proportional to the square of the carrier signal wavelength, results in a very high spreading loss. On the other hand, the absorption from water vapor molecules further increases the path-loss and limits the available bandwidth for distances above several meters.

Given the limited output power of THz transceivers, highgain directional antennas are needed to communicate over distances beyond a few meters. Similarly as in lower frequency communication systems, antenna arrays can be utilized to implement Multiple Input Multiple Output (MIMO) communication systems, which are able to increase either the communication distance by means of beamforming, or the achievable data rates by means of spatial multiplexing. For example, MIMO systems with 2, 4 or 8 antennas in transmission and in reception are common in current wireless communication standards, such as IEEE 802.11ac or 4G LTE-A networks. In these applications, due to the limited available bandwidth, MIMO is mainly utilized to increase the spectral efficiency and achievable data rates by exploiting spatially uncorrelated channels.

More recently, the concept of Massive MIMO has been introduced. In this case, much larger antenna arrays with tens to hundreds of elements are utilized to increase the spectral efficiency. Moreover, by creating two-dimensional or planar antenna arrays instead of one-dimensional or linear arrays, the radiated signals can be controlled both in the elevation and the azimuth directions, thus enabling 3D or Full-Dimension (FD) MIMO. However, there are several shortcomings which limit their use in practical applications. In particular:

At frequencies under 5 GHz, the size of the arrays is on the order of a few square meters for tens of antennas, which limits their deployment to base stations only.

For mm-wave systems, the footprint of the arrays is on the order of a few square centimeters for tens of antennas. While this enables their integration in mobile devices, this number would not be enough to overcome the higher path-loss at mm-wave frequencies over several tens of meters.

When moving to the THz band, antennas become even smaller and many more elements can be embedded in the same footprint. For example, the size of an array with a hundred elements is on the order of a few square millimeters. However, a much larger number of elements would be needed to overcome the path-loss in the THz band. While it would be possible to embed a thousand antennas in a few square centimeters, there would be many challenges in dynamically controlling such array with traditional architectures, which would limit the feasibility of this approach.

Therefore, there is a need for a communications system that can support massive MIMO THz band communications.

SUMMARY OF THE INVENTION

The disadvantages of the prior art are overcome by the present invention which, in one aspect, is a communication element that includes a high electron mobility transistor including a gate layer. A graphene layer is disposed on the gate layer.

In another aspect, the invention is a communication system that includes a signal source, a plasmonic transmitter, a first plasmonic antenna, a second plasmonic antenna, a plasmonic receiver and a signal detector. The signal source is configured to generate a transmitted signal. The plasmonic transmitter is responsive to the transmitted signal and is configured to generate a first surface plasmonic polariton wave signal corresponding to the transmitted signal. The first plasmonic antenna is responsive to the first surface plasmonic polariton wave signal and is configured to generate an electromagnetic signal corresponding to the surface plasmon polariton wave signal. The second plasmonic antenna is responsive to the electromagnetic signal and is configured to generate a second surface plasmon polariton wave signal corresponding to the electromagnetic signal. The plasmonic receiver is responsive to the second surface plasmon polariton wave signal and is configured to generate a received signal corresponding to the second surface plasmon polariton wave signal. The signal detector is configured to detect the received signal.

In another aspect, the invention is a communication system that includes a two-dimensional array of a plurality of plasmonic nano-antennas. Each plasmonic nano-antenna supports a surface plasmon polariton wave. A plurality of communications elements each excite a corresponding one of the plasmonic nano-antennas, thereby causing a surface plasmon polariton wave that corresponds to a signal to form on each of the plasmonic nano-antennas.

In yet another aspect, the invention is a communicating system that includes a two-dimensional array of a plurality of plasmonic nano-antennas. Each plasmonic nano-antenna supports a surface plasmon polariton wave. Each plasmonic nano-antenna includes a metallic ground plane, a substrate disposed on the metallic ground plane and a graphene layer disposed thereon. A plurality of communications elements each excite a corresponding one of the plasmonic nano-antennas, thereby causing a surface plasmon polariton wave that corresponds to a signal to form on each of the plasmonic nano-antennas. Each of the communications elements includes a high electron mobility transistor. Each high electron mobility transistor includes: a source region; a drain region; a channel region disposed between the source region and the drain region, the channel region including a first material; a gate layer disposed on the channel region, the gate layer including a second material that forms a heterojunction with the first material, which induces a two dimensional electron gas in the channel region; and a graphene layer disposed on the gate layer.

These and other aspects of the invention will become apparent from the following description of the preferred embodiments taken in conjunction with the following drawings. As would be obvious to one skilled in the art, many variations and modifications of the invention may be effected without departing from the spirit and scope of the novel concepts of the disclosure.

DETAILED DESCRIPTION OF THE INVENTION

Figure 1:
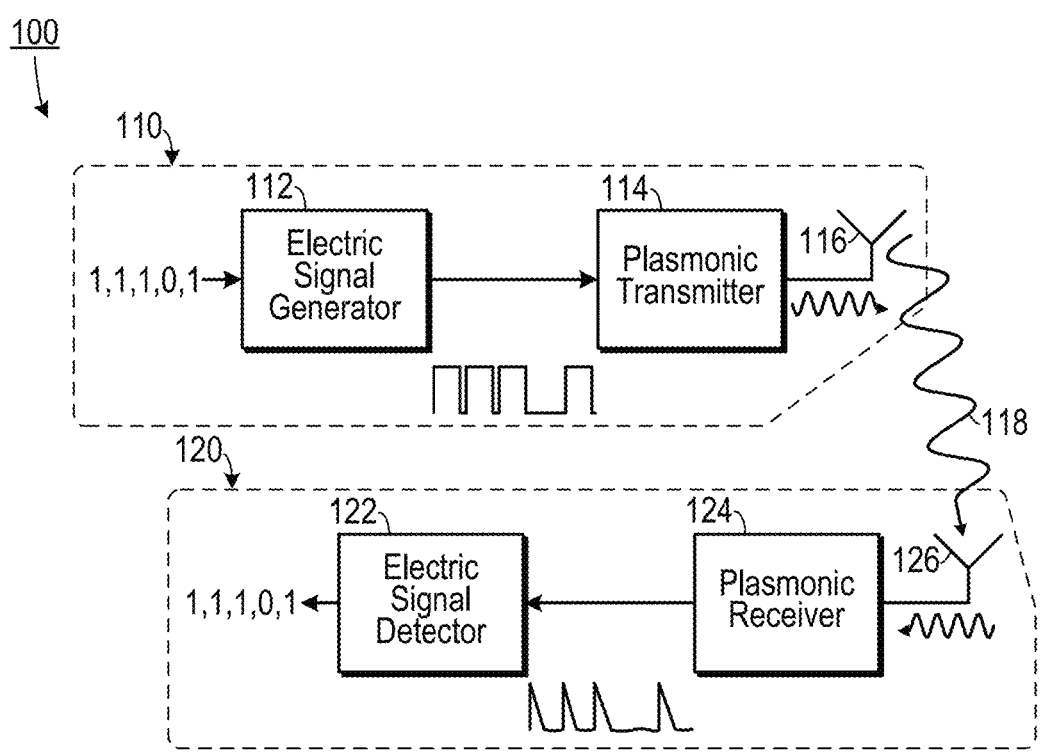
FIG. 1 is a block diagram of a communication system.

A preferred embodiment of the invention is now described in detail. Referring to the drawings, like numbers indicate like parts throughout the views. Unless otherwise specifically indicated in the disclosure that follows, the drawings are not necessarily drawn to scale. As used in the description herein and throughout the claims, the following terms take the meanings explicitly associated herein, unless the context clearly dictates otherwise: the meaning of "a," "an," and "the" includes plural reference, the meaning of "in" includes "in" and "on." U.S. patent application Ser. No. 14/253,539, filed on Apr. 15, 2014, discloses plasmonic nano-antennas and is incorporated herein by reference for the purpose of disclosing the same. U.S. Pat. No. 7,978,394, issued to Johnson et al. discloses plasmonic metamaterials and is incorporated herein by reference for the purpose of disclosing the same.

As shown in FIG. 1, one embodiment of a THz band plasmonic-based communications system includes a transmitting unit 110 that transmits a THz band electromagnetic signal 118 to a receiving unit 120. The transmitting unit 110 typically includes a signal generator 112 that generates an electric signal. A plasmonic transmitter 114 generates a surface plasmonic polariton (SPP) signal, which corresponds to the electric signal, that is converted to the electromagnetic signal 118 by a first plasmonic nano-antenna 116. The electromagnetic signal 118 is received by a second plasmonic nano-antenna 126, which is part of the receiving unit 120. The second plasmonic nano-antenna 126 converts the electromagnetic signal 118 to an SPP signal that is converted into an electric signal by a plasmonic receiver 124 and the electric signal is then processed by an electric signal detector 122.

Figure 2A:
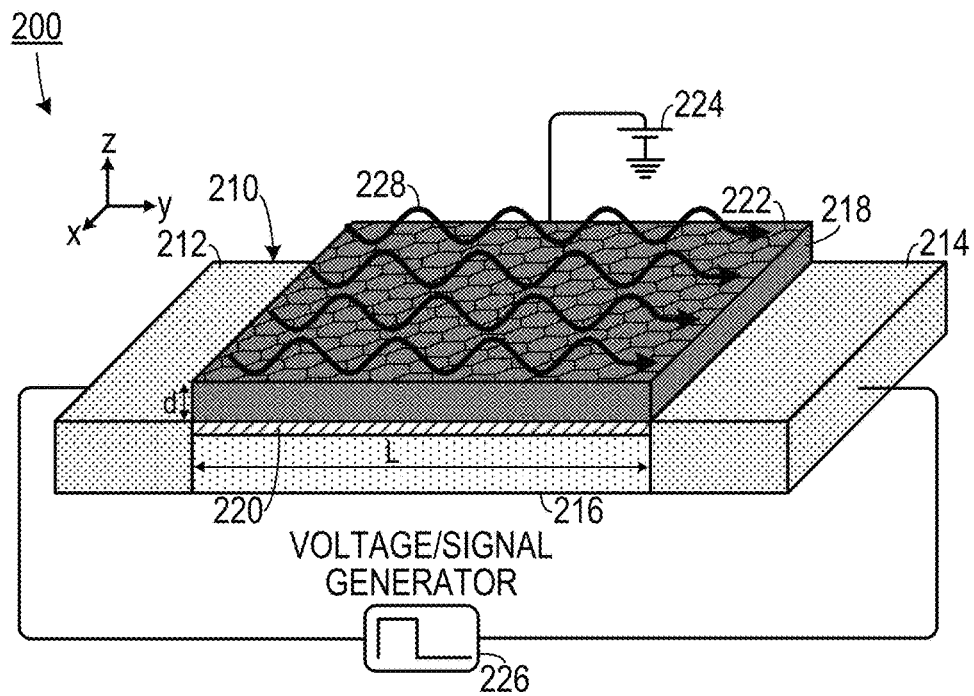
FIG. 2A is a top front view of a first embodiment of a plasmonic communication element configured as transmitter.

As shown in FIG. 2A, a plasmonic transmitter 200 can include a high electron mobility transistor (HEMT) 210 made with a III-V semiconductor with a graphene layer 222 (which could be a single layer of graphene or multiple layers of graphene) disposed on the gate layer 218 of the HEMT 210. The HEMT 210 includes a source region 212 and a drain region 214. A channel region 216 (which, in one embodiment, would typically have a length on the order of a hundred nanometers) is disposed between the source region 212 and the drain region 214. The gate layer 218 is disposed on the channel region 216. The channel region 216 includes a first material (such as an undoped direct band gap semiconductor, for example GaN, GaAs) and the gate layer 218 includes a second material (such as a doped semiconductor, for example InGaAs) that forms a heterojunction with the first material, which induces a two dimensional electron gas 220 in the channel region. The gate layer 218 can be biased with a bias voltage 224 to tune the response of the HEMT 210. When a signal generator 226 applies a voltage signal between the source region 212 and the drain region 214, the signal travels as electrons move through the electron gas layer 220, which induces a confined plasma wave that resonates in the THz band, which induces an SPP signal 228 corresponding to the voltage signal in the interface between the gate layer 218 and the graphene layer 222. The SPP signal 228 is then used to excite an SPP signal in a plasmonic antenna.

Figure 2B:
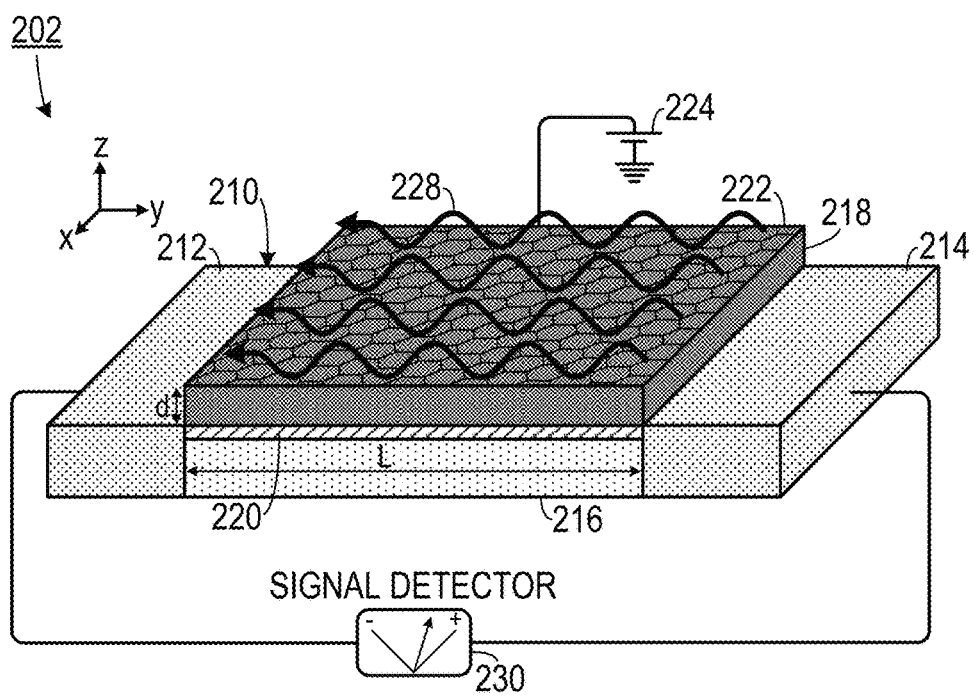
FIG. 2B is a top front view of a first embodiment of a plasmonic communication element configured as a receiver.

As shown in FIG. 2B, a similar element can be configured as a plasmonic receiver 202, in which a signal detector 230 is coupled to the source region 212 and the drain region 214. In this configuration, when an SPP signal is imparted from an antenna onto the graphene layer 222—gate layer 218 interface, a voltage signal is detectable between the source region 212 and the drain region 214 by the signal detector 230.

Figure 3A:
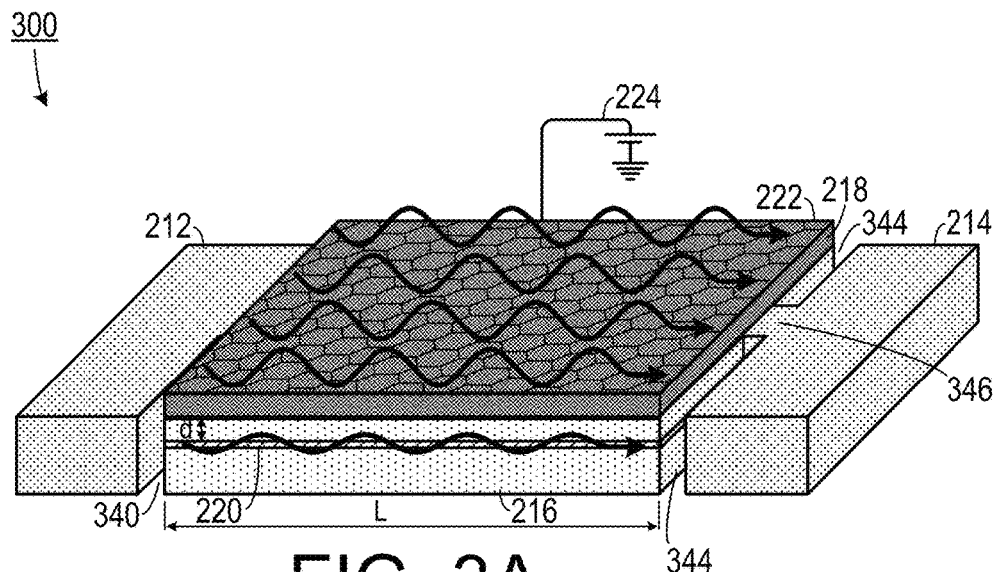
FIG. 3A is a top front view of a second embodiment of a plasmonic communication element
Figure 3B:
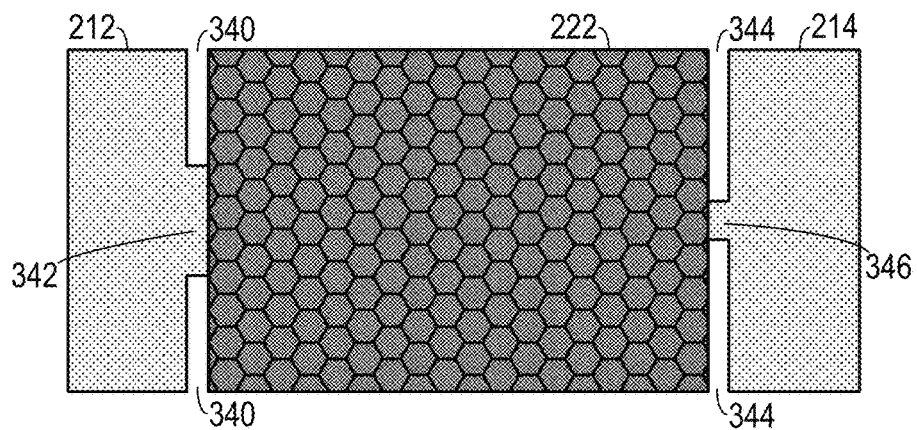
FIG. 3B is a top plan view of the embodiment shown in FIG. 4A.

As shown in FIGS. 3A and 3B, in one embodiment of a communication element 300, a first constriction 342 is formed between the source region 212 and the channel region 220 by a first pair of oppositely disposed notches 340. Similarly, as second constriction 344 is formed between the drain region 214 and the channel region 220 by a second pair of oppositely disposed notches 344. In this embodiment, the first constriction 342 is wider than the second constriction 346. Selection of the widths of the first constriction 342 and the second constriction 344 can be used to tune the device.

Figure 4A:
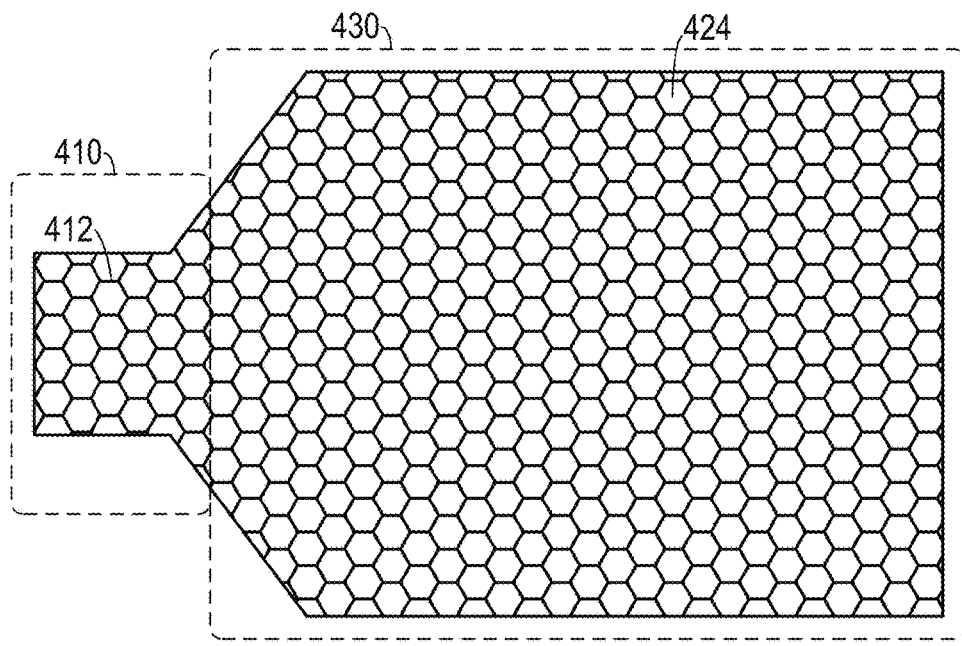
FIG. 4A is a top plan view of ab embodiment of a plasmonic communication element coupled to a plasmonic antenna.
Figure 4B:
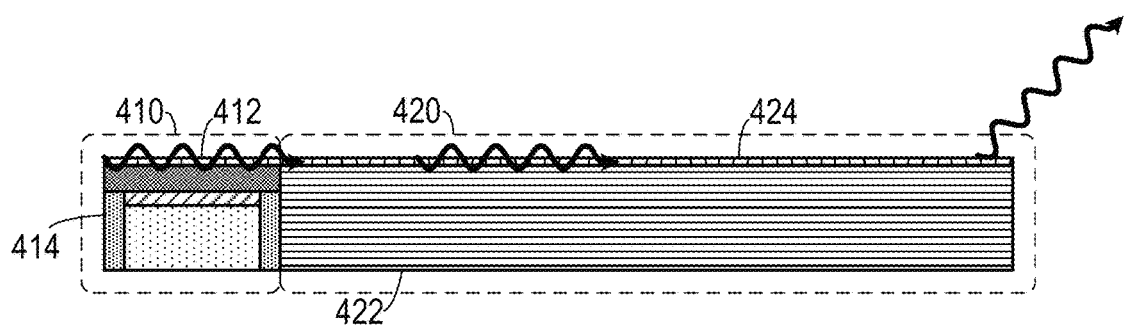
FIG. 4B is a side elevational view of the embodiment shown in FIG. 4A.

In one embodiment, as shown in FIGS. 4A and 4B, a plasmonic nano-antenna 420 can be coupled to a communications element 410 by coupling the graphene layer 412 on the HEMT 414 to a graphene layer 424 on a substrate 422. The SPP signal formed in the communications element 410 (when in the transmitter configuration) excites a corresponding SPP signal in the plasmonic nano-antenna 420, which generates a corresponding THz band electromagnetic signal. When this element is configured as a receiver, an incoming THz band electromagnetic signal induces an SPP signal in the plasmonic nano-antenna 420, which excites an SPP signal in the communications element 410, which in turn causes electrons to resonate in the 2D electron gas of the HEMT 414. This results in a corresponding voltage signal being induced across the HEMT 414.

Unlike to existing THz band sources, in this embodiment, the plasma wave is not directly radiated, but is used to induce a propagating SPP wave at the interface with the graphene layer. The oscillating image charge created at the graphene-semiconductor interface in response to the confined plasma wave oscillation in the 2DEG results in a coupled oscillating charge distribution at or near the frequency at which the system is driven. Due to the complex conductivity of graphene at THz band frequencies, this global oscillation of charge in the graphene-semiconductor interface results in an SPP wave. The propagation constant of the SPP wave, which can be tuned by modifying the chemical potential of the graphene layer, determines the SPP wave propagation length and confinement factor.

The unique properties of plasmonic materials can be leveraged to overcome limitations of current MIMO technologies. In particular, instead of relying on conventional metals, nanomaterials such as graphene and metamaterials can be utilized to build miniature nano-antennas and nano-transceivers which can efficiently operate in the THz band. Their very small size enables their integration in very dense plasmonic nano-antenna arrays, which bring unprecedented opportunities for THz communication.

The embodiment that follows discloses ultra-massive (UM) MIMO communication in the THz band. UM MIMO communication relies on the possibility to integrate a very large number of nano-antennas in very small footprints to increase the communication distance and the achievable data rates at THz-band frequencies. For frequencies in the 0.06-1 THz range, metamaterials enable the design of plasmonic antenna arrays with hundreds of elements in a few square centimeters (e.g., 144 elements in 1 $cm^2$ at 60 GHz). In the 1 to 10 THz band, graphene-based plasmonic nano-antenna arrays with thousands of elements can be embedded in a few square millimeters (e.g., 1024 elements in 1 $mm^2$ at 1 THz). The resulting nano-antenna arrays can be utilized both at the transmitter and the receiver to simultaneously overcome the spreading loss problem, by focusing the transmitted signal in space, and the molecular absorption loss problem, by focusing the spectrum of the transmitted signal in the absorption-free windows. As a result, wireless Tbps links can be established between compact electronic devices which are several tens of meters apart.

Plasmonic Nano-Antenna Arrays

Miniaturization of the Antennas

In general terms, the length of a resonant antenna is approximately half of the wavelength at the resonance frequency. In the THz band, the wavelength ranges from 5 mm at 60 GHz to just 30 µm at 10 THz. For example, a metallic antenna tuned to resonate at 1 THz needs to be approximately $lm \approx \lambda/2 = 150$ µm long. While this result already shows the potential for the development of very large THz antenna arrays, even more substantial gains can be achieved by utilizing plasmonic materials to develop nano-antennas and nano-transceivers.

Plasmonic materials are metals or metal-like materials which support the propagation of Surface Plasmon Polariton (SPP) waves. SPP waves are confined electromagnetic waves that appear at the interface between a metal and a dielectric as a result of global oscillations of the electrical charges. Different plasmonic materials can support SPP waves at different frequencies. Noble metals such as gold and silver support SPP waves at infrared and optical frequencies. Graphene, a one atom-thick carbon-based nanomaterial with unprecedented mechanical, electrical and optical properties, supports the propagation of SPP waves at THz-band frequencies. Metamaterials, i.e., engineered arrangements of nano-structured building blocks, can be designed to support SPP waves at many frequency bands, including mm-wave frequencies.

The unique propagation properties of SPP waves enable the development of novel plasmonic nano-antennas. In particular, SPP waves propagate at a much lower speed than EM waves in free space. As a result, the SPP wavelength $\lambda_{spp}$ is much smaller than the free-space wavelength $\lambda$. The ratio $\gamma=\lambda/\lambda_{spp}>1$ is known as the confinement factor and depends on the plasmonic material and the system frequency. The confinement factor can be obtained by solving the SPP wave dispersion equation with the boundary conditions imposed by the specific device geometry. Different from metallic antennas, the resonance length of a plasmonic antenna is given by $lp \approx \lambda_{spp}/2=\lambda/(2\gamma)$ and, thus, plasmonic antennas are much smaller than the metallic antennas.

Motivated by these properties, graphene can be used to develop THz plasmonic nano-antennas. The confinement factor $\gamma$ in graphene ranges between 10 to 100. As a result, graphene-based plasmonic nano-antennas are just a few micrometers long and only hundreds of nanometers wide, i.e., almost two orders of magnitude smaller than the metallic THz antennas. Moreover, the resonance frequency of graphene-based plasmonic nano-antennas can be dynamically tuned. In particular, the propagation properties of the SPP waves in graphene depend on its dynamic complex conductivity. The conductivity, on its turn, depends on the dimensions of the graphene structure and its Fermi energy, i.e., the highest energy-band occupied by the electrons in the material. Interestingly, the Fermi energy can be easily modified by means of material doping or electrostatic bias. As a result, the SPP wave propagation properties and, thus, the confinement factor can be dynamically tuned.

However, the short propagation length of SPP waves in graphene for frequencies under 1 THz limits the performance of graphene-based plasmonic nano-antennas at lower frequencies. Alternatively, plasmonic metamaterials can be utilized to develop plasmonic nano-antennas for frequencies between 60 GHz and 1 THz. The propagation properties of SPP waves on metamaterials as low as 10 GHz have been demonstrated. While SPP waves can propagate on metamaterials at such frequencies, their confinement factor $\gamma$ is usually under 10, and, thus, the miniaturization gains are lower than at frequencies above 1 THz. In addition, conventional metamaterials tend not to be tunable. However, newer Software Defined Meta-materials (SDMs) have been recently been demonstrated. The fundamental idea in SDMs is to combine conventional metamaterials with nanoscale communication networks to dynamically control the properties of the metamaterial by switching the state of its building blocks. Such an approach could be utilized to change the effective permittivity or conductivity of the metamaterial and, thus, modify the confinement factor in real-time.

Integration of Many Antennas

Figure 5:
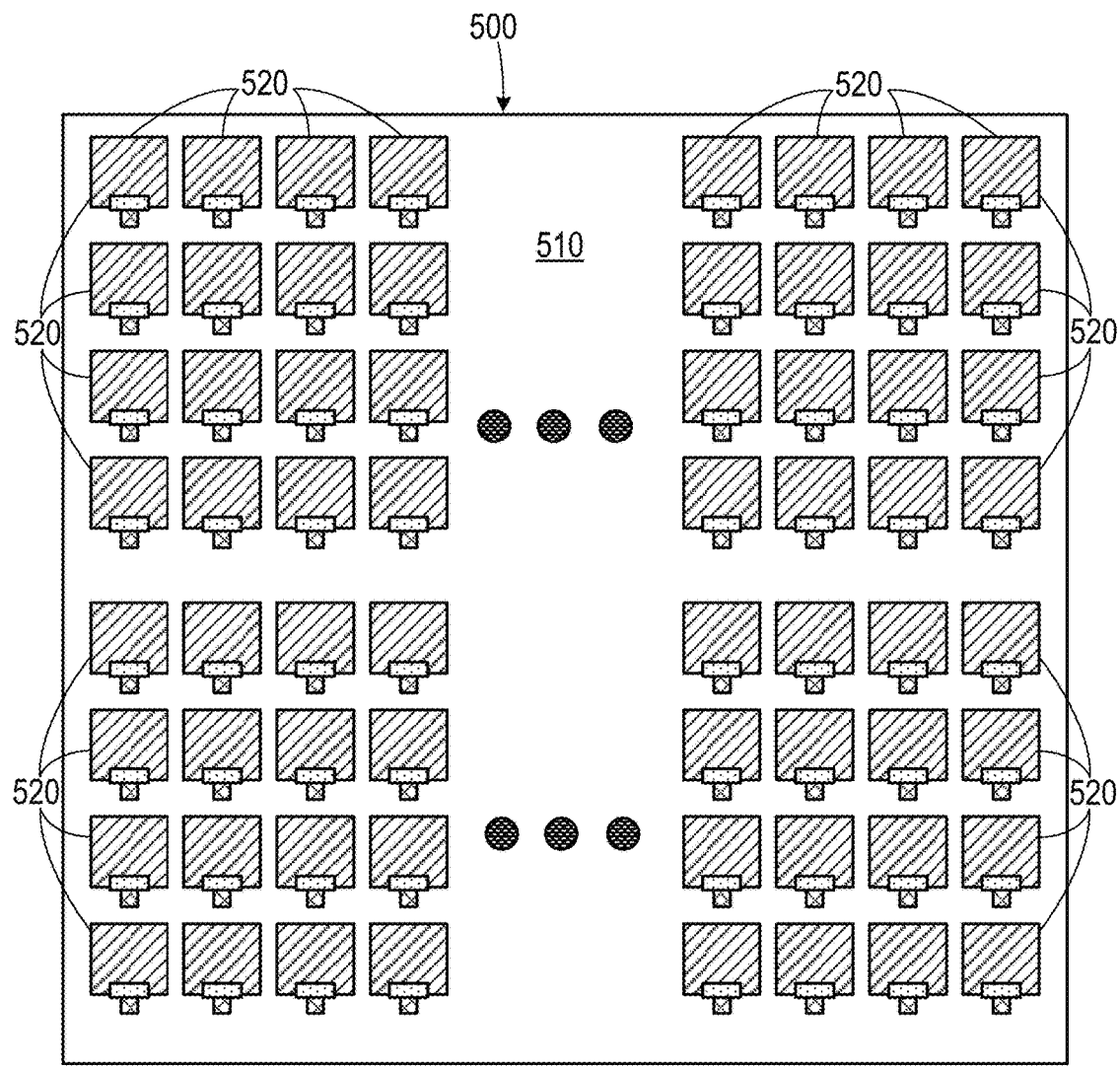
FIG. 5 is a plan view schematic diagram of an antenna array.
Figure 6A:
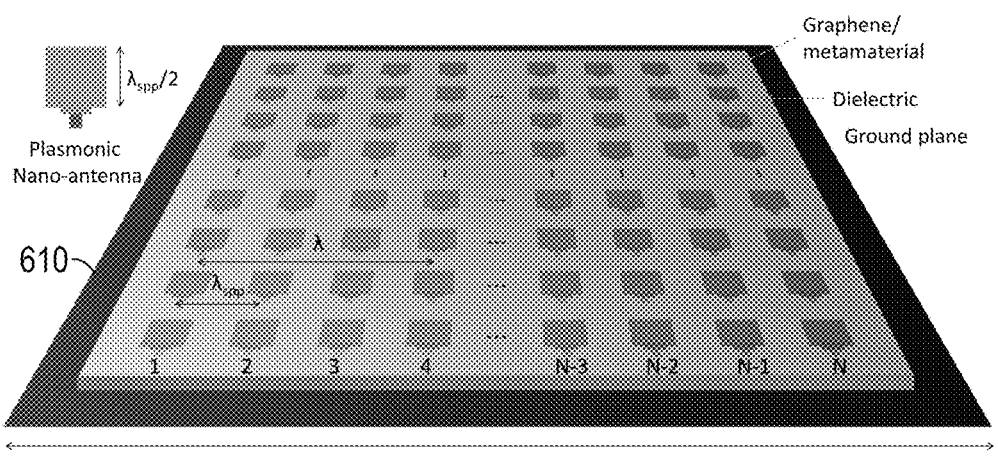
FIGS. 6A-6C are a series of schematic diagrams showing different configurations for antenna arrays.

Despite high radiation efficiency, the effective area of plasmonic nano-antennas is very small. Nevertheless, this small size enables the creation of very dense nano-antenna arrays in a very small footprint. A conceptual plasmonic nano-antenna array 500 is shown in FIG. 5 and FIG. 6A, which includes rows and columns of plasmonic nano-antennas 520 disposed on a substrate 510. In addition to the size of the antennas, the total number of elements depends on the minimum required separation between the antennas and the maximum allowable footprint for the array. The minimum separation between the nano-antennas 520 is defined as the distance at which there is no significant mutual coupling between them. It can be shown that the mutual coupling between plasmonic nano-antennas 520 drops quickly when the separation between the two nano-elements approaches the plasmonic wavelength $\lambda_{spp}$. Therefore, the plasmonic confinement factor $\gamma$ plays a key role on the number of elements that can be integrated in a fixed footprint.

Without loss of generality, the footprint S of a uniform square planar plasmonic nano-antenna array with N elements per side is given by $S=(N\lambda/\gamma)^2$. In the experimental example discussed below, the footprint is a function of the total number of antennas for four different scenarios: 1) a metallic antenna array at 60 GHz; 2) a metamaterial-based plasmonic nano-antenna array at 60 GHz; 3) a metallic antenna array at 1 THz; and, 4) a graphene-based plasmonic nano-antenna array at 1 THz. We consider a confinement factor $\gamma=4$ for metamaterials and $\gamma=25$ for graphene. When operating at 60 GHz, the use of metamaterials can help to reduce the footprint by more than one order of magnitude. For example, 1024 plasmonic nano-antennas would occupy 10 cm$^2$, whereas the same number of metallic antennas would require 100 cm$^2$. This array would be too large to be embeddable in conventional mobile communication devices. For frequencies 1 THz and above, the very high confinement factor of graphene brings major reductions in the array footprint. For example, when operating at 1 THz, 1024 metallic antennas can be packed in a 1 cm$^2$ footprint, whereas less than 1 mm$^2$ would be needed to integrate the same number of plasmonic nano-antennas. The very small size of the plasmonic nano-antenna arrays allows its integration in all sort of communication devices. These results further highlight the benefits of utilizing plasmonic materials to design antennas and antenna arrays.

Feeding and Control of the Antennas

To operate the array, one must be able to generate and control the amplitude or at least the time delay/phase of the SPP wave at each nano-antenna. For the time being, several alternatives to generate the plasmonic signals at THz-band frequencies have been considered. For frequencies under 1 THz, standard Silicon (Si) Complementary Metal Oxide-Semiconductor (CMOS) technology, Silicon Germanium (SiGe) technology and III-V semiconductor technologies such as Gallium Nitride (GaN), Gallium Arsenide (GaAs), and Indium Phosphide (InP) can be utilized to generate a high-frequency electrical signal. By means of a plasmonic grating structure, a SPP wave could be then launched to the metamaterial-based antennas.

For frequencies above 1 THz, different mechanisms to excite SPP waves can be considered. These can be classified either as optical or electrical pumping techniques. In terms of optical pumping, Quantum Cascade Lasers (QCLs) combined with grating structures can be configured to excite SPP waves. However, although QCLs can provide high-power THz signals, their performance quickly degrades at room temperature. Infra-red lasers and photoconductive antennas can also be utilized to excite SPP waves. However, the need for an external laser limits the feasibility of this approach in practical setups. For electrical pumping, sub-micrometric High-Electron Mobility Transistors (HEMTs) based on compound semiconductors materials as well as graphene can be utilized to excite SPP waves. While the individual power of each HEMT is expectedly very low, their very small size and possibility to operate at room motivate their further exploration.

The distribution of the plasmonic signal through the nano-antenna array depends on the excitation mechanism. When relying on optical pumping, a single laser could be utilized to simultaneously excite SPP waves on all the nano-antennas, due to the relatively large aperture of the required lasers. While this would simplify the feeding of the nano-antennas, it would also limit the applications of the array, as all the elements would be fed with the same time-delay or phase. For the case of electrical pumping, different approaches can be considered. On the one hand, following a conventional scheme, a single or small group of HEMT-based nano-transceivers can be used to generate the required signals and then rely on a plasmonic waveguide and plasmonic delay/phase controllers to distribute the signals with the adequate phase to the different nano-antennas. However, given the low power generated by a single nano-transceiver (a few microwatts) and the limited propagation length of SPP waves (only a few wavelengths), the performance of the nano-antenna array would be compromised. Alternatively, the very small size of individual plasmonic sources allows them to be integrated with each nano-antenna, thus, enabling the equivalent of a fully-digital architecture. This does not only increase the total radiated power, but can potentially simplify the control of the nano-antenna array needed to support UM MIMO communication.

Ultra-Massive MIMO Communication

The possibility to create very large controllable nano-antenna arrays enables UM MIMO communication systems in the THz band. The objective of UM MIMO is to maximize the utilization of the THz band over long distances, by overcoming the two main phenomena that affect the propagation of THz signals, namely, the spreading loss and the molecular absorption loss. Next, we describe the working modes of UM MIMO and present initial performance estimates.

Dynamic UM MIMO

By dynamically adapting the amplitude and time-delay/phase of the plasmonic signals at each nano-antenna, different UM MIMO operation modes are defined, ranging from UM beam-forming to UM spatial multiplexing.

UM Beamforming

In this case, all the nano-antennas are fed with the same plasmonic signal, as in conventional beamforming. The main advantage from UM MIMO comes from the much larger number of nano-antennas that can be integrated in one array. However, there are two main differences with conventional arrays. On the one hand, the possibility to integrate a plasmonic signal source within each nano-antenna results in a higher output power, independently of the separation of the antennas or the time-delay/phase between them. In traditional architectures, either a single signal is distributed among all the elements or an "array-of-sub-arrays" architecture is used, in which each subarray is actively powered. As a result, the gain of the plasmonic nano-antenna array is higher. However, on the other hand, the fact that nano-antennas are placed much closer to each other reduces the beamforming abilities of the array.

Without loss of generality, consider a uniform broadside direction. The array gain in the pointing direction is shown for different array technologies as a function of the array footprint. The results have been obtained by analyzing the array factor and nano-antenna response of a time-delay array under the assumption of negligible mutual coupling. For graphene-based plasmonic nano-antenna arrays, the results for the smaller footprints with up to 128 elements in transmission and in reception have been validated by means of simulations with COMSOL multi-physics. At 60 GHz, the gain of a 100 $mm^2$ metamaterial-based plasmonic nano-antenna array can be up to 40 dB, i.e., almost 25 dB higher than that of a metallic antenna array with the same footprint. At 1 THz, the gain of a 1 $mm^2$ graphene-based plasmonic nano-antenna array is up to 55 dB, or almost 35 dB more than that of a conventional metallic antenna array with the same footprint. It is relevant to note that this higher gain is achieved not only because of the higher number of nano-antennas, but also due to the fact that each nano-antennas is actively powered by a nano-transceiver. This can also be seen from the array beam solid angle.

The beam solid angle in the pointing direction can be illustrated for different arrays as a function of their footprint. While the use of plasmonic materials enables the integration of a very large number of antennas in a very small footprint, such arrays will not exhibit beamforming capabilities unless they extend over at least half free-space wavelength. This is due to the spatial correlation between nano-antennas which are less than $\lambda/2$ apart. While this could motivate the decision to spread the nano-antennas over $\lambda/2$, without taking advantage of the plasmonic confinement, there are many new opportunities enabled by densely integrating them, such as the possibility to create interleaved sub-arrays for spatial multiplexing.

In order to illustrate the impact of UM beamforming, consider a specific numerical example. In particular, the absorption-defined transmission window at 1 THz, which has approximately 120 GHz of bandwidth at 10 m. The total path-loss at 1 THz exceeds 115 dB over 10 meters. If the transmission power is 0 dBm and the noise power at the receiver is −80 dBm, it can be easily shown that a 1024× 1024 UM beamforming scheme, with 40 dB of gain in transmission and in reception, can support wireless data links of almost 2 Tbps at 10 m. However, it is relevant to note that the available bandwidth in the THz band shrinks as the transmission distance is increased and, thus, trying to increase the capacity by simply adding more antennas is not the best that can be done. Instead of that, it might be more effective to simultaneously transmit over multiple windows.

UM Spatial Multiplexing

Figure 6B:
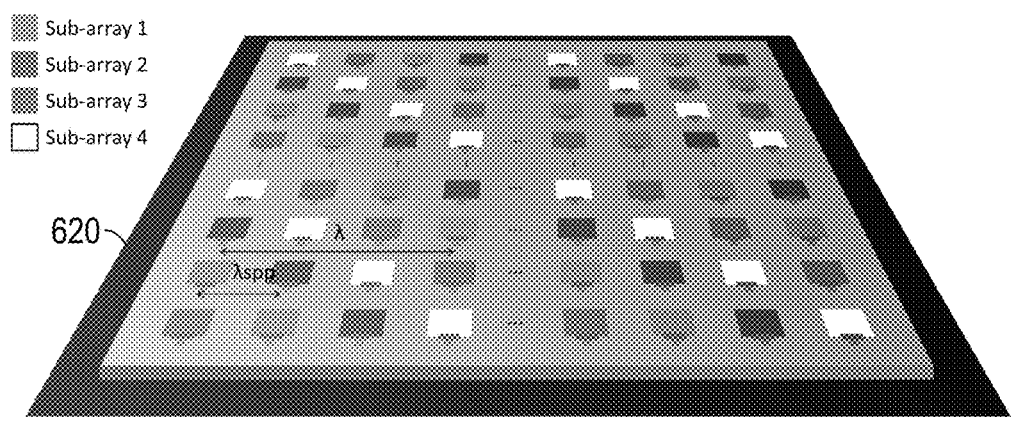
Figure 6C:
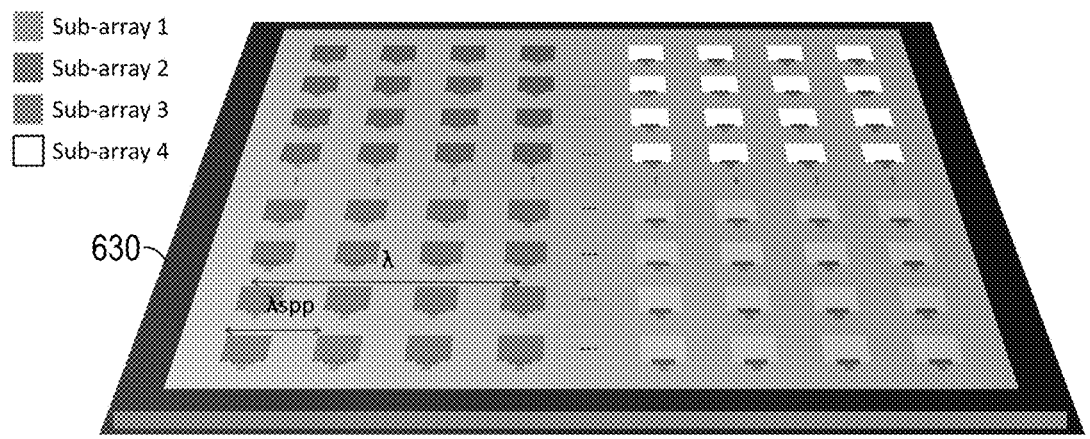

Very large antenna arrays can be virtually divided to support multiple broader and lower-gain beams in different directions. As in conventional MIMO or massive MIMO, those beams can be utilized to exploit spatial diversity and increase the capacity of a single-user link or to create independent separate links between different users. Moreover, the possibility to independently control the signal at each nano-antenna by means of the aforementioned plasmonic nano-transceivers enables innovative ways to group the array elements which can increase the number of simultaneous beams while maintaining relatively narrow beams. For example, instead of dividing the array in separate sub-arrays, the sub-arrays can be physically interleaved, as shown in FIGS. 6B-6C. As a result, the separation between elements in each virtual sub-array can be increased without affecting the physical footprint of the system. As discussed above, in order to perform beamforming, the array elements need to extend an area of at least half wavelength but no longer than one full wavelength, to prevent the presence of grating lobes. In the case of a non-interleaved sub-array (as shown in FIG. 6B), the achievable gain per beam would be compromised not only because each sub-array has fewer active elements, but also because they are too close to exhibit beamforming capabilities. Alternatively, by interleaving the sub-array elements (as shown in FIG. 6C), the separation between elements can be increased to $\lambda/2$ and thus, beamforming gain is obtained.

The gain per beam is a function of the number of beams for both separate sub-arrays and interleaved sub-arrays, when considering a graphene-based plasmonic nano-antenna array with 1024 elements at 1 THz. On the one hand, the 1024 nano-antennas can be utilized to create a single beam. This case corresponds to the UM beamforming. On the other hand, each nano-antenna is utilized to transmit create a separate beam. In between, square planar sub-arrays are created by grouping the plasmonic nano-antennas. For example, a total of 64 sub-arrays with 16 elements each can be created. The gain of each beam can be in the order of 12 dB if non-interleaved sub-arrays are utilized, and can be increased to 22 dB per beam by interleaving the sub-arrays. These results highlight the benefits of sub-array interleaving and motivate the development of new array pattern synthesis methodologies.

Multi-Band UM MIMO

Until this point, the example of the array was designed to operate at a specific frequency window. However, for distances beyond a few meters, the THz band exhibits multiple absorption-defined transmission windows. To maximize the utilization of the THz channel and enable the targeted Tbps links, more than one window might be needed.

Multi-band UM MIMO enables the simultaneous utilization of different transmission windows by leveraging the capabilities of plasmonic nano-antenna arrays. The idea is to virtually divide one nano-antenna array into multiple sub-arrays and to tune each sub-array to operate at a different center frequency. Each transmission window is effectively narrowband, i.e., its bandwidth is much smaller than its center frequency. This simplifies the design of each nano-antenna as well as the dynamic control of the nano-antenna array.

There are several unique capabilities of plasmonic nano-antenna arrays which enable multi-band UM MIMO communication. On the one hand, as discussed above, the frequency response of an individual plasmonic nano-antenna can be electronically tuned. Therefore, the response of individual elements in the array can be dynamically and independently modified. On the other hand, the required spacing between antenna elements can be adapted by choosing the right elements to contribute to the array. For example, the elements should be chosen so that their separation is approximately $\lambda/2$ at the targeted frequency band. The very high density of elements, whose separation is much shorter than the free-space wavelength, provides the required "granularity" to create the required spacing at the desired frequency. Moreover, "virtual" sub-arrays at different frequencies can be interleaved as previously discussed. All these opportunities introduce many challenges and motivate further analyses of the proposed schemes. Ultimately, the possibility to create very dense nano-antenna arrays, with individually tunable and controllable elements, introduce many opportunities to the design of dynamic and multiband UM MIMO schemes which can make the most of the THz band.

Fabrication of Plasmonic Nano-Antenna Arrays

The complexity in the fabrication of the THz antenna arrays depends on their underlying technology. For metallic antennas, the main challenge is posed by the design of the array feeding and control network. The development of an array-of-sub-arrays architecture and the balancing between the operations done in the analog domain or in the digital domain, similar to what is done mm-wave communication systems, are necessary steps towards building the first THz arrays. The problem becomes more challenging when metamaterials or nanomaterials are utilized to build plasmonic nano-antenna arrays. For metamaterials, the first step is to identify the nano-block that will be utilized to build the material. An array of subwavelength copper-based patches was utilized as the support for SPP waves at frequencies as low as 10 GHz, but other building blocks such as split ring resonators could be utilized instead. In addition, the signal excitation, control and distribution network would have to be interleaved with the metamaterial design.

When it comes to graphene, the possibility to create the plasmonic signal source, time-delay/phase controller and antenna out of the same material simplifies the fabrication of the array. Currently, graphene can be obtained by various methods, but only micro-mechanical exfoliation and chemical vapor deposition can consistently produce high-quality samples. Once the graphene layer is obtained, the array needs to be defined on it. Currently, chemical and plasma etching techniques can be used to cut the required structures out of graphene. However, to define thousands of antennas and their feeding network, more accurate techniques should be used. For example, lithographical methods based on the use of ion beams to "outline" the array can enable transformative ways to define arrays and their control network.

Terahertz-band communication can become a key wireless technology to satisfy the need for ultra-high data-rates in the next five to ten years. UM MIMO communication has been disclosed as a way to overcome the very high propagation loss at THz-band frequencies while fully exploiting the very large bandwidth in the THz band and, thus, enabling wireless Tbps links between compact devices over several tens of meters. This disclosure describes technology for UM MIMO systems, namely, the use of plasmonic nano-antennas and nano-transceivers as the building block for plasmonic nano-antenna arrays. For frequencies in the 0.06-1 THz range, metamaterial-based nano-antennas can be utilized to create plasmonic nano-antenna arrays with hundreds of elements in a few square centimeters both in transmission and in reception. For example, 144×144 UM MIMO at 60 GHz is possible with 1 $cm^2$ arrays. At higher frequencies (1-10 THz), graphene-based plasmonic nano-antenna arrays with thousands of elements can be embedded in a few square millimeters. For instance, a 1024×1024 UM MIMO system at 1 THz is realizable with arrays that occupy just 1 $mm^2$ Ultimately, the higher the frequency the larger the number of antennas, but the more challenging it becomes to operate the array.

The above described embodiments, while including the preferred embodiment and the best mode of the invention known to the inventor at the time of filing, are given as illustrative examples only. It will be readily appreciated that many deviations may be made from the specific embodiments disclosed in this specification without departing from the spirit and scope of the invention. Accordingly, the scope of the invention is to be determined by the claims below rather than being limited to the specifically described embodiments above.

What is claimed is:

1. A communication system, comprising:
   (a) a two-dimensional array of a plurality of plasmonic nano-antennas, each plasmonic nano-antenna supporting a surface plasmon polariton wave, wherein each of the plurality of plasmonic nano-antennas comprises:
      (i) a first metallic ground plane;
      (ii) a substrate disposed on the first metallic ground plane; and
      (iii) a graphene layer disposed on the substrate; and
   (b) a plurality of communications elements that each excite a corresponding one of the plasmonic nano-antennas, thereby causing a surface plasmon polariton wave that corresponds to a signal to form on each of the plasmonic nano-antennas, wherein each of the communications elements comprises:
      (i) a high electron mobility transistor (HEMT) that includes a gate region; and (ii) a second graphene layer disposed on the gate region of the HEMT, the second graphene layer extending from the graphene layer of a corresponding plasmonic nano-antenna.

2. The communication system of claim 1, wherein the HEMT further includes:
(a) a source region;
(b) a drain region; and
a channel region disposed between the source region and the drain region, the channel region including a first material, the gate layer being disposed on the channel region, the gate layer including a second material that forms a heterojunction with the first material, which induces a two dimensional electron gas in the channel region.

3. The communication system of claim 1, wherein each of the plurality of plasmonic nano-antennas comprises a plasmonic metamaterial.

4. The communication system of claim 1, wherein each of the plurality of plasmonic nano-antennas is excited simultaneously with a common signal by the communications elements.

5. The communication system of claim 1, wherein a first subset of the plurality of plasmonic nano-antennas is excited simultaneously with a first signal and where a second subset of the plurality of plasmonic nano-antennas is excited simultaneously with a second signal that is different from the first signal.

6. A communicating system, comprising:
(a) a two-dimensional array of a plurality of plasmonic nano-antennas, each plasmonic nano-antenna supporting a surface plasmon polariton wave, each plasmonic nano-antenna including a metallic ground plane, a substrate disposed on the metallic ground plane and a graphene layer disposed thereon; and
(b) a plurality of communications elements that each excite a corresponding one of the plasmonic nano-antennas, thereby causing a surface plasmon polariton wave that corresponds to a signal to form on each of the plasmonic nano-antennas, each of the communications elements including a high electron mobility transistor that includes:
(i) a source region;
(ii) a drain region;
(iii) a channel region disposed between the source region and the drain region, the channel region including a first material;
(iv) a gate layer disposed on the channel region, the gate layer including a second material that forms a heterojunction with the first material, which induces a two dimensional electron gas in the channel region; and
(v) a graphene layer disposed on the gate layer.

7. The communicating system of claim 6, wherein the channel region comprises a direct band gap semiconductor and wherein the gate layer comprises a doped semiconductor.

8. The communicating system of claim 7, wherein the direct band gap semiconductor comprises at least one of GaN and GaAs, and wherein the doped semiconductor comprises InGaAs.

9. The communicating system of claim 6, configured as a transmitter that is responsive to a transmitted electrical signal applied between the source region and the drain region, wherein the plasmonic antenna is configured to generate an electromagnetic signal corresponding to the transmitted electrical signal.

10. The communicating system of claim 6, configured as a receiver in which the plasmonic antenna is responsive to an electromagnetic signal and generates a surface plasmon polariton wave signal corresponding thereto thereby causing an electrical signal corresponding to the electromagnetic signal that is detectable between the source region and the drain region.

11. The communicating system of claim 6, wherein the source region, the drain region and the channel region form a substantially rectangular shape having a first end and an opposite second end, the source region comprising a first portion across the first end, the drain region comprising a second portion across the second end, the channel region comprising a third portion disposed between the first portion and the second portion, the gate layer disposed on the third portion.

12. The communicating system of claim 11, wherein the first portion defines a first constriction between the source region and the channel region and wherein the second portion defines a second constriction between the channel region and the drain region.

13. The communicating system of claim 12, wherein the second constriction is narrower than the first constriction.

14. The communicating system of claim 12, wherein the first constriction is formed by at least one first notch defined by the first portion adjacent to the third portion and wherein the second constriction is formed by at least one second notch defined by the second portion adjacent to the third portion.

15. A communication system, comprising:
(a) a two-dimensional array of a plurality of plasmonic nano-antennas, each plasmonic nano-antenna supporting a surface plasmon polariton wave, wherein each of the plurality of plasmonic nano-antennas comprises:
(i) a first metallic ground plane;
(ii) a substrate disposed on the first metallic ground plane; and
(iii) a graphene layer disposed on the substrate; and
(b) a plurality of communications elements that each excite a corresponding one of the plasmonic nano-antennas, thereby causing a surface plasmon polariton wave that corresponds to a signal to form on each of the plasmonic nano-antennas, wherein each of the communications elements comprises:
(i) a high electron mobility transistor (HEMT) that includes a gate region, wherein the HEMT includes: a source region; a drain region; and a channel region disposed between the source region and the drain region, the channel region including a first material, the gate layer being disposed on the channel region, the gate layer including a second material that forms a heterojunction with the first material, which induces a two dimensional electron gas in the channel region; and
(ii) a second graphene layer disposed on the gate region of the HEMT, the second graphene layer extending from the graphene layer of a corresponding plasmonic nano-antenna.

16. The communication system of claim 15, wherein each of the plurality of plasmonic nano-antennas comprises a plasmonic metamaterial.

17. The communication system of claim 15, wherein each of the plurality of plasmonic nano-antennas is excited simultaneously with a common signal by the communications elements.

18. The communication system of claim 15, wherein a first subset of the plurality of plasmonic nano-antennas is excited simultaneously with a first signal and where a second subset of the plurality of plasmonic nano-antennas is excited simultaneously with a second signal that is different from the first signal.

* * * * *